(12) United States Patent
Chen et al.

(10) Patent No.: US 8,363,423 B2
(45) Date of Patent: Jan. 29, 2013

(54) MOUNTING DEVICE FOR PRINTED CIRCUIT BOARD

(75) Inventors: Yun-Lung Chen, Taipei Hsien (TW); Da-Long Sun, Shenzhen (CN); Guo-Zhong Liu, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 222 days.

(21) Appl. No.: 12/903,085

(22) Filed: Oct. 12, 2010

(65) Prior Publication Data

US 2011/0317376 A1 Dec. 29, 2011

(30) Foreign Application Priority Data

Jun. 23, 2010 (CN) .......................... 2010 1 0207292

(51) Int. Cl.
*H05K 7/02* (2006.01)
*H05K 7/04* (2006.01)

(52) U.S. Cl. .................... 361/810; 361/807; 361/809

(58) Field of Classification Search .................. 361/728, 361/730, 796, 752, 800, 825, 807, 809, 810; 174/138 E, 138 G; 312/223.1, 223.2
See application file for complete search history.

(56) References Cited

U.S. PATENT DOCUMENTS

| | | | | |
|---|---|---|---|---|
| 2,037,586 A * | 4/1936 | Olson | | 411/188 |
| 6,362,978 B1 * | 3/2002 | Boe | | 361/825 |
| 6,813,165 B2 * | 11/2004 | Cheng et al. | | 361/801 |
| 6,856,518 B2 * | 2/2005 | Dobbs et al. | | 361/801 |
| 6,906,266 B2 * | 6/2005 | Verrigni | | 174/138 G |
| 7,310,235 B2 * | 12/2007 | Chen et al. | | 361/752 |
| 7,400,319 B2 * | 7/2008 | Nakayama et al. | | 345/177 |
| 7,515,433 B2 * | 4/2009 | Jornod et al. | | 361/756 |
| 7,591,623 B2 * | 9/2009 | Parker | | 411/180 |
| 2002/0027017 A1 * | 3/2002 | Petri | | 174/250 |

* cited by examiner

*Primary Examiner* — Hung S Bui
(74) *Attorney, Agent, or Firm* — Altis Law Group

(57) ABSTRACT

A mounting device for a printed circuit board includes a supporting board, a connecting piece and a mounting member. The supporting board includes non-metallic material. The connecting piece is configured to secures the supporting board to a chassis. The connecting piece has a connecting claw penetrating into the supporting board. The mounting member assembly is attached to the supporting board.

20 Claims, 8 Drawing Sheets

MOUNTING DEVICE FOR PRINTED CIRCUIT BOARD

BACKGROUND

1. Technical Field

The present disclosure relates to mounting devices for printed circuit boards, especially to a detachable mounting device for a printed circuit board.

2. Description of Related Art

Printed circuit boards (PCB), such as a motherboard or an expansion card, must be firmly mounted in computer enclosures. Conventionally, the PCB is directly mounted to a computer chassis through rivets or screws. The computer chassis may also form protrusions for receiving the rivets or screws and supporting the PCB. It is a time-consuming process to manufacture the protrusions on a computer chassis.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
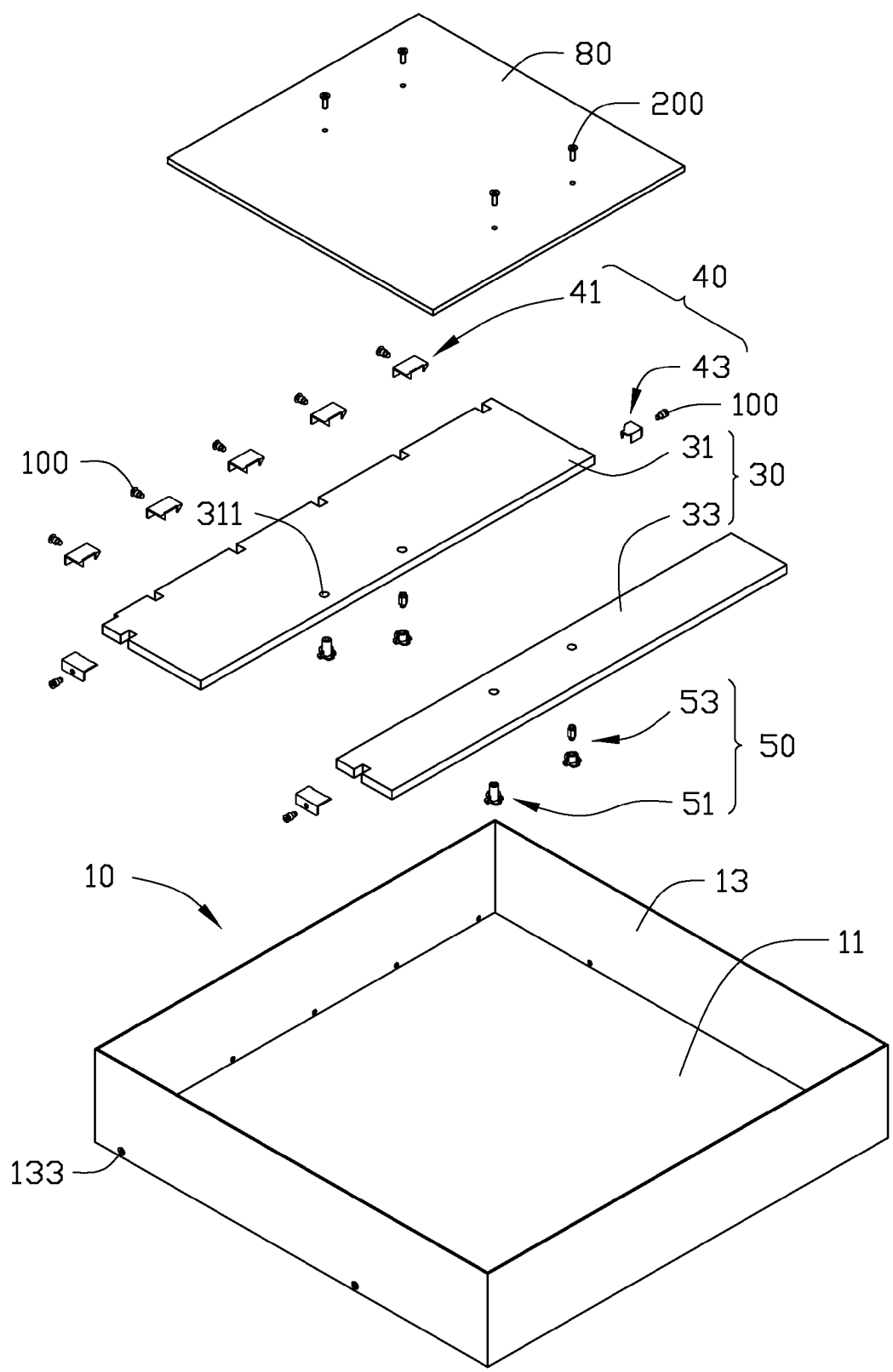
FIG. 1 is an exploded, isometric view of a PCB and a mounting device according to an embodiment.

Referring to FIG. 1, a mounting device in one embodiment is used for supporting and mounting a printed circuit board (PCB) 80, such as a motherboard, to a chassis 10.

The chassis 10 includes a bottom wall 11, and four side walls 13 substantially perpendicular to the bottom wall 11. A rivet hole 133 is defined in at least two of the four side walls 13.

The mounting device further includes a supporting board assembly 30, a connecting piece assembly 40 for connecting the supporting board assembly 30 to the chassis 10, and two mounting member assemblies 50 for securing the PCB 80.

The supporting board assembly 30 is made of non-metallic material. In one embodiment, the supporting board assembly 30 is made of medium density fiberboard. The supporting board assembly 30 may include one or more supporting boards to support and mount the PCB 80. In one embodiment, the supporting board assembly 30 includes a first supporting board 31 and a separate second supporting board 33 for saving material. Take the first supporting board 31 for illustration. The first supporting board 31 is rectangular. Two through holes 311 are defined in the first supporting board 31.

Figure 2:
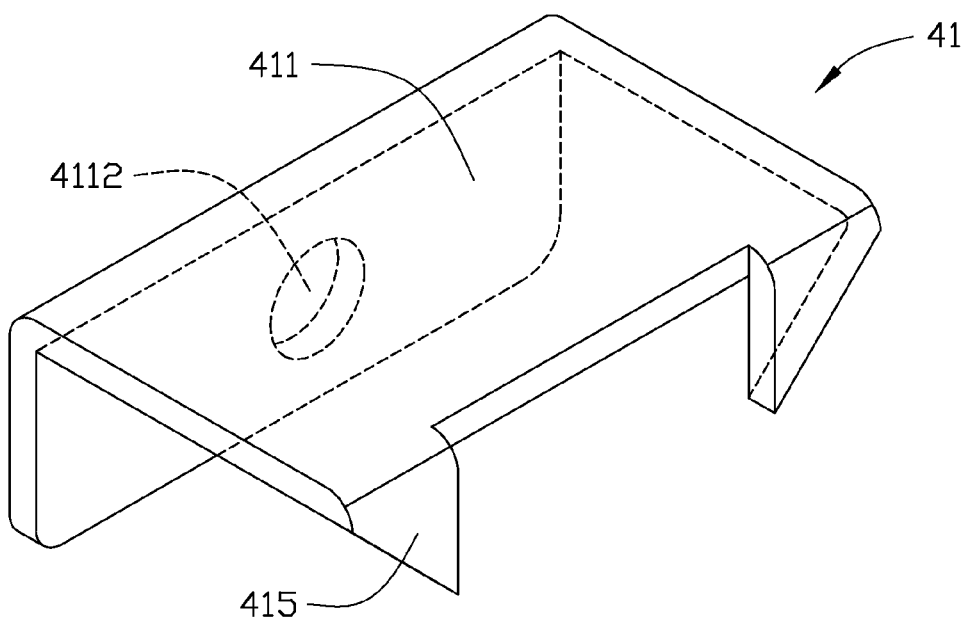
FIG. 2 is an enlarged view of a side connecting piece of FIG. 1.
Figure 3:
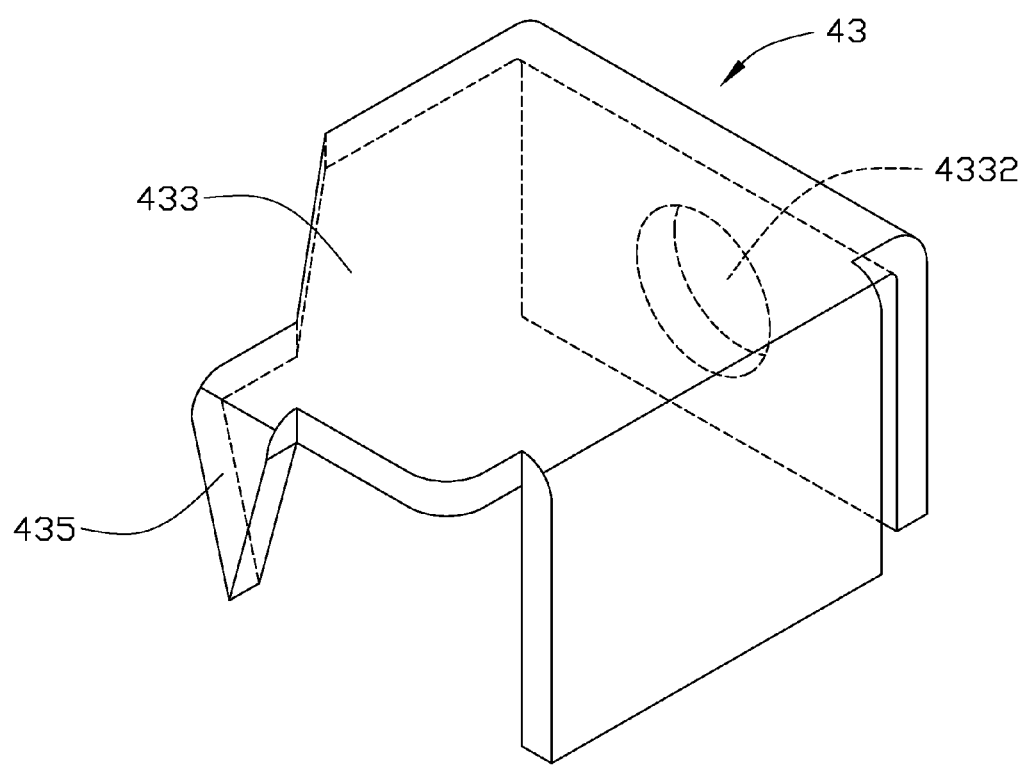
FIG. 3 is an enlarged view of a corner connecting piece of FIG. 1.

Referring to FIG. 1, FIG. 2 and FIG. 3, in one embodiment, the connecting piece assembly 40 includes a plurality of side connecting pieces 41 and a corner connecting piece 43. The side connecting pieces 41 are fixed to a side edge of the first supporting board 31 or the second supporting board 33. The corner connecting piece 43 is fixed to a corner of the first supporting board 31 and/or the second supporting board 33. Each of the side connecting pieces 41 may be made of metal. Each of the side connecting pieces 41 has a L-shaped connecting body 411 and two first claws 415 extending from the connecting body 411 towards the supporting board assembly 30. Each of the first claws 415 is tapered. A rivet hole 4112 is defined in each connecting body 411 corresponding to one of the rivet holes 133 of the chassis 10. The corner connecting piece 43 includes three connecting plates 433 and a second connecting claw 435 extending from one of the connecting plates 433 towards the supporting board assembly 30. The second connecting claw 435 is tapered. A rivet hole 4332 is defined in one of the connecting plates 433 corresponding to one of the rivet holes 133 of the chassis 10. In one embodiment, the side connecting pieces 41 and the corner piece 43 may be used interchangeably for securing the supporting board assembly 30 to the chassis 10.

Figure 4:
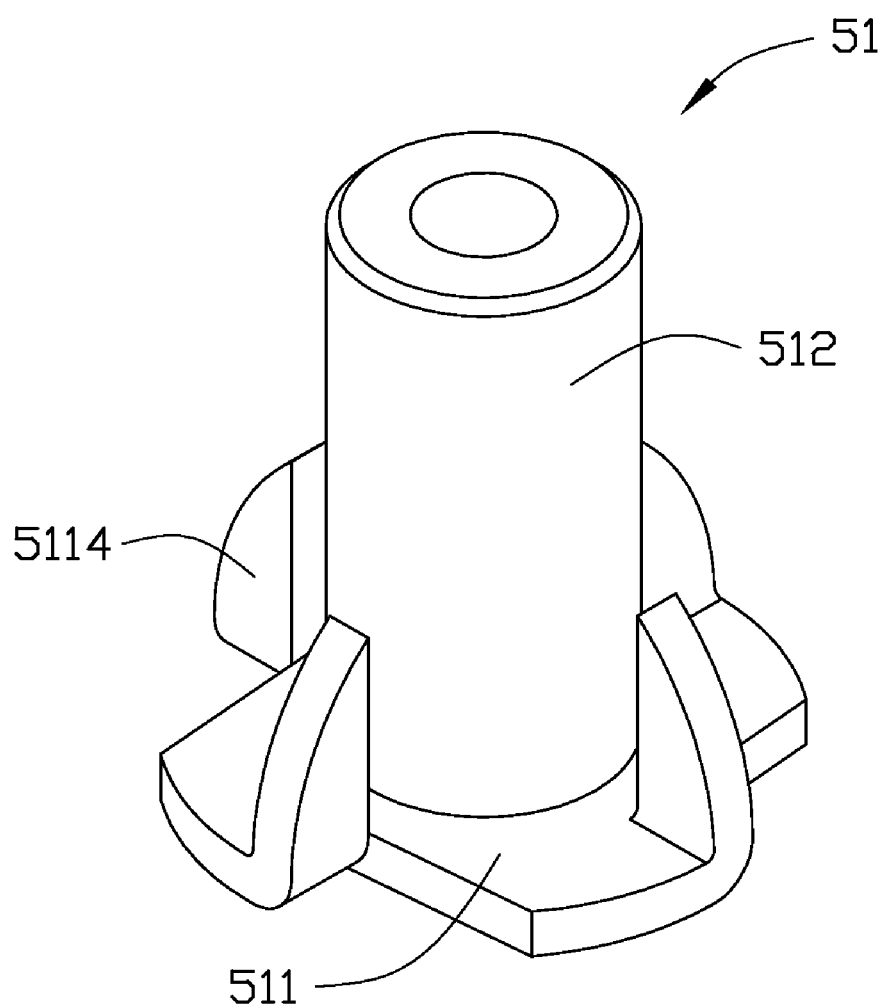
FIG. 4 is an enlarged view of a first mounting member of FIG. 1.
Figure 5:
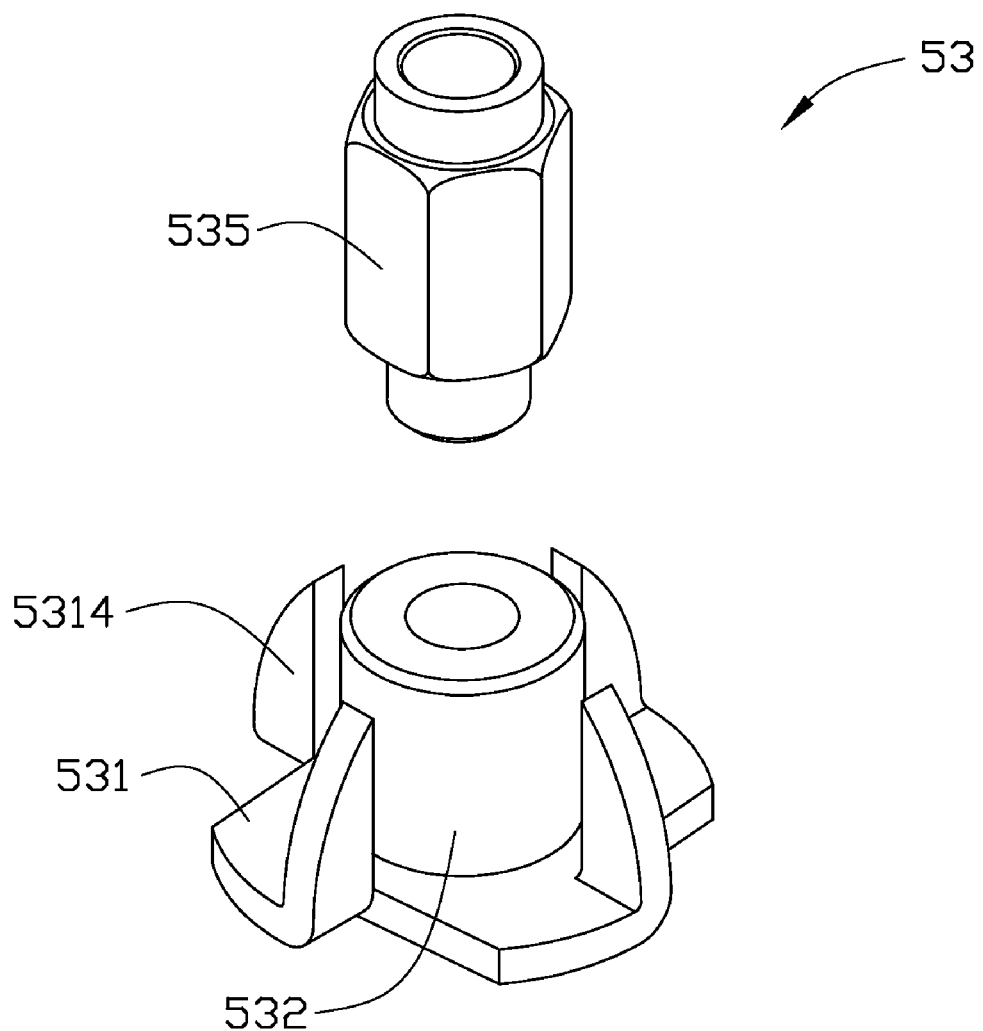
FIG. 5 is an enlarged view of a second mounting member of FIG. 1.

Referring to FIG. 1, FIG. 4 and FIG. 5, in one embodiment, each mounting member assembly 50 may include a first mounting member 51 and a second mounting member 53. The first mounting member 51 and a second mounting member 53 may be used interchangeably.

The first mounting member 51 includes a first base plate 511 and a first sleeve 512. The first sleeve 512 has internal threads. The first sleeve 512 is higher than the thickness of the first supporting board 31 or the second supporting board 33. Four first mounting claws 5114 extends from the first base plate 511. Each first mounting claw 5114 has a straight side edge, along the first sleeve edge 512, and an arcuate side edge, along the angular edge. In one embodiment, the first base plate 511 may be circular before the first mounting claw 5114 is formed.

The second mounting member 53 includes a second base plate 531, a second sleeve 532, and a separate locater 535, located on top of the second sleeve 532. The second base plate 531 has four second claws 5314. In one embodiment, the second base 531 may has same structure as the first base 511. The second sleeve 532 has internal threads for engaging the locater 535. The locater 535 has internal threads.

Figure 6:
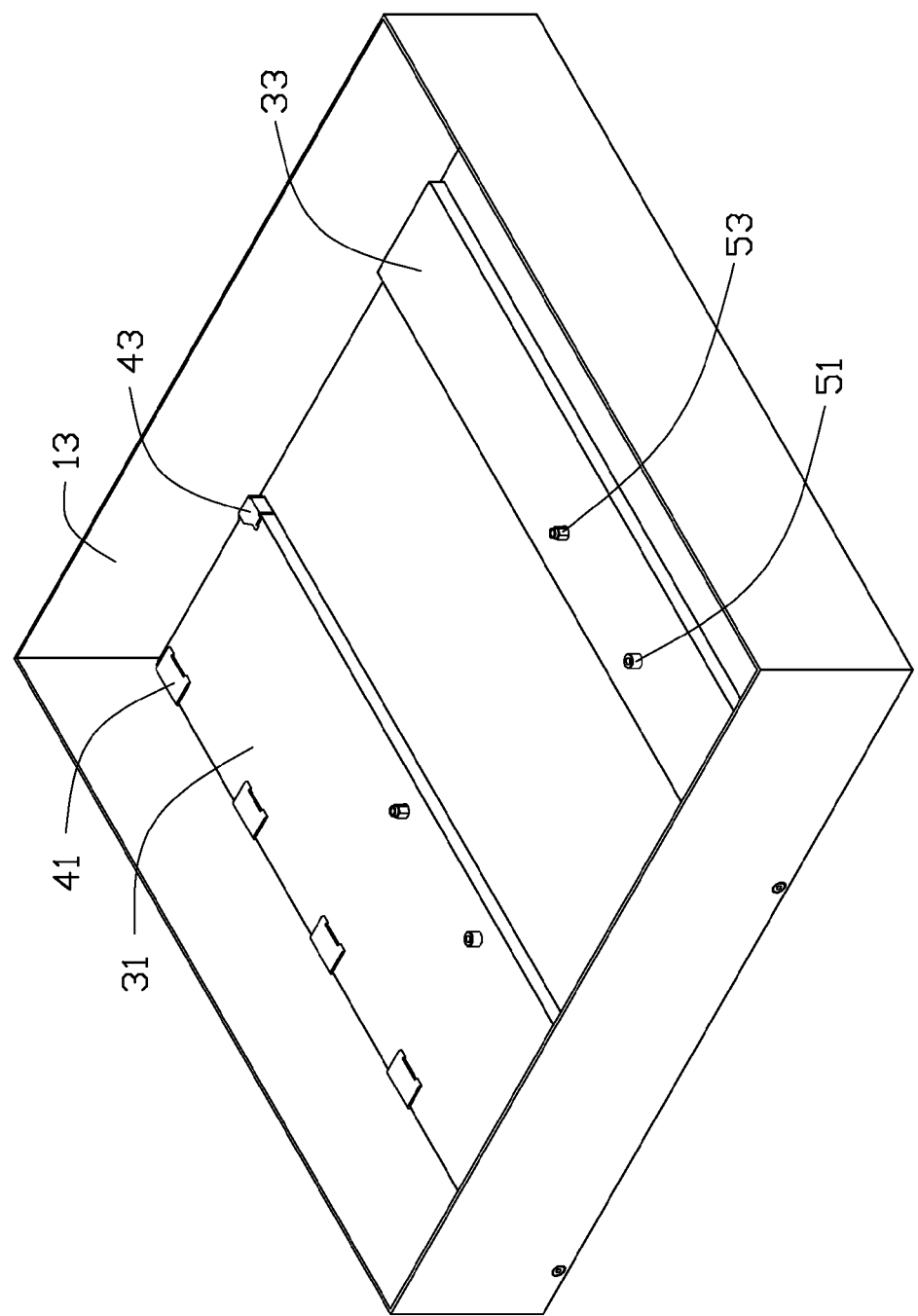
FIG. 6 is an assembled view of the mounting device of FIG. 1.
Figure 7:
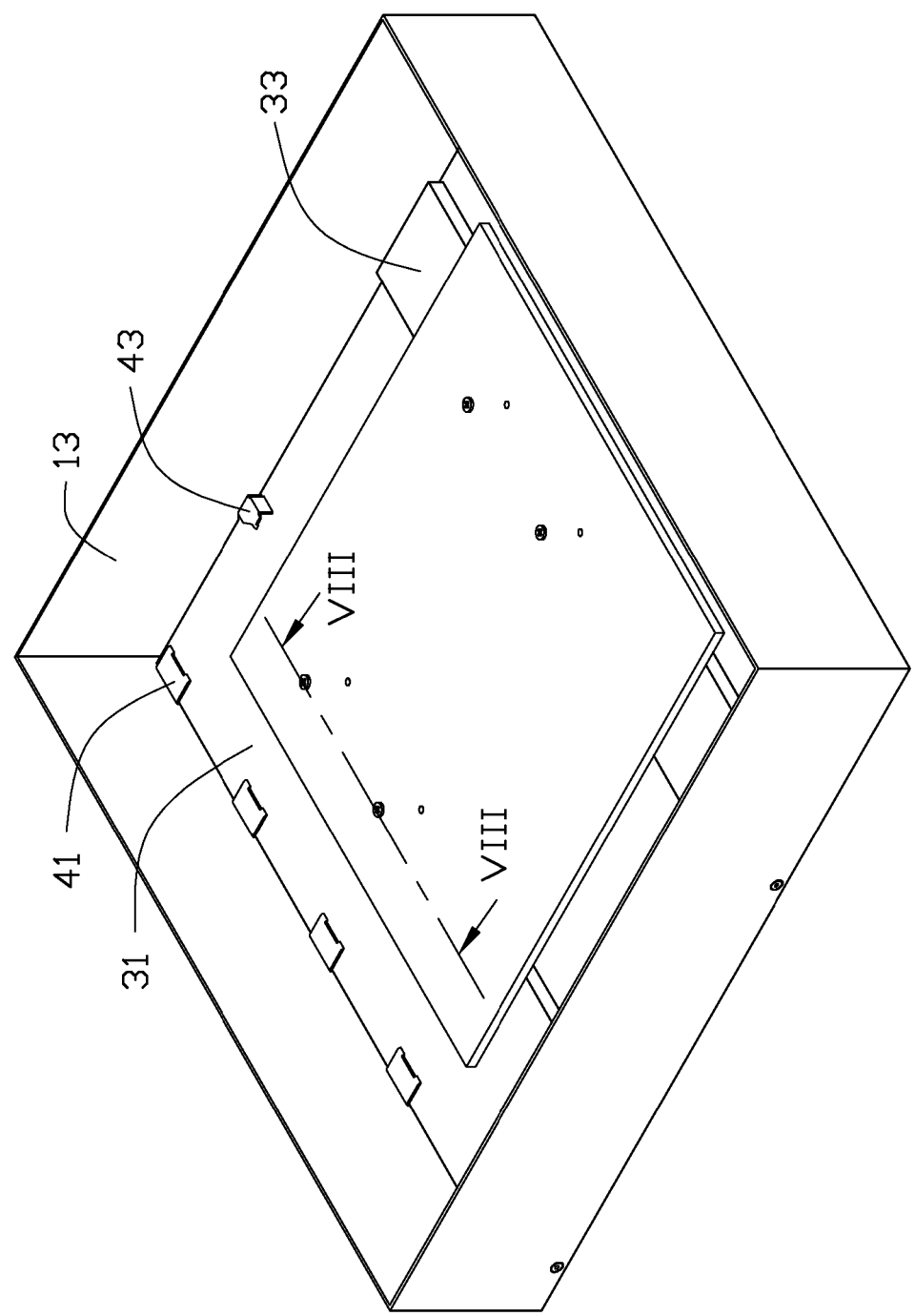
FIG. 7 is an assembled view of FIG. 1.
Figure 8:
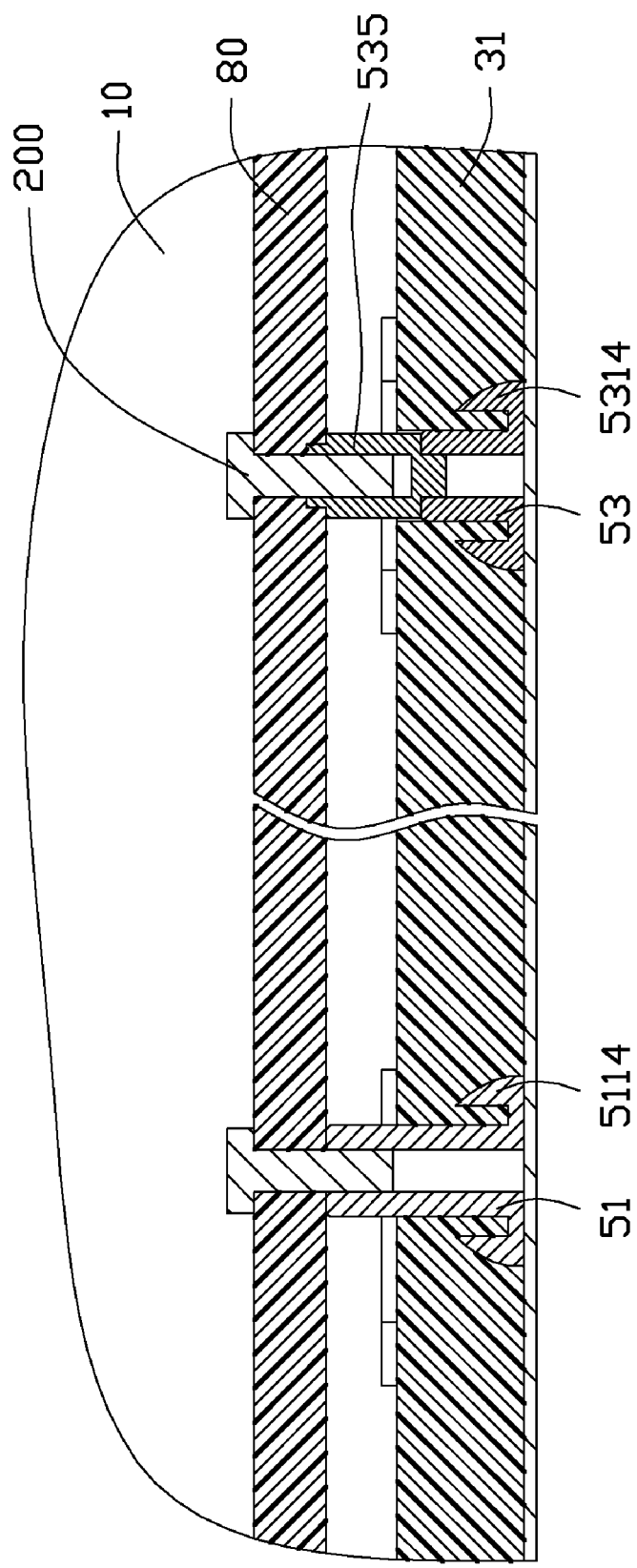
FIG. 8 is a partially, cross-section view taken along line VIII-VIII of FIG. 7.

Referring to FIG. 1, FIG. 6 and FIG. 7, during assembling the mounting device, in one embodiment, the first mounting member 51, the second mounting member 53, the side connecting pieces 41, and the corner connecting piece 43 are all used. The first claws 415, of the side connecting pieces 41, directly penetrates into the first supporting board 31 from a top surface of the first supporting board 31. The side connecting pieces 41 are riveted to the chassis 10 through a plurality of rivets 100. As the same mounting method to the side connecting pieces 41, the corner connecting piece 43 is also secured to the corner portion of the first supporting board 31. As the same mounting method to the first supporting board 31, the second supporting board 33 is mounted to the chassis 10. The first mounting claws 5114 of the first mounting member 51 and the second mounting claws 5314 of the second mounting member 53 directly penetrate into the bottom surface of the first supporting board 31. The first sleeve 512 extends through the corresponding through hole 311. The first sleeve 512 extends into the corresponding through hole 311. The locater 535 is screwed into the second sleeve 532. The second sleeve 532 has substantially the same height as the assembled second mounting member 53. The first base plate 511 and the second base plate 531 are connected to the chassis 10 acting as a ground for the PCB 80. Another mounting member assembly 50 is fixed to the second supporting board 33 in the same way as the first supporting board 31.

During mounting the PCB 80, the PCB 80 is mounted to the first supporting board 31 and the second supporting board 33 by a plurality of fasteners 200 extending into the first mounting member 51 and the second mounting member 53. A space is left between the PCB 80, and the first mounting member 51 and the second mounting member 53.

It is also to be understood, however, that even though numerous characteristics and advantages have been set forth in the foregoing description of preferred embodiments, together with details of the structures and functions of the preferred embodiments, the disclosure is illustrative only. Changes may be made in detail, especially in matters of shape, size, and arrangement of parts within the principles of the disclosure to the full extent indicated by the broad general meaning of the terms in which the appended claims are expressed.

What is claimed is:

1. A mounting device for a printed circuit board, comprising:
    a supporting board, the supporting board comprising non-metallic material;
    a connecting piece, the connecting piece being secured to a chassis and configured to secure the supporting board to the chassis, the connecting piece comprising a connecting claw penetrating into the supporting board; and
    a mounting member engaged into the supporting board.

2. The mounting device of the claim 1, wherein the supporting board comprises medium density fiberboard.

3. The mounting device of the claim 1, wherein the mounting member comprises a sleeve, and the sleeve is higher than a thickness of the supporting board.

4. The mounting device of the claim 1, wherein the connecting piece comprises metal.

5. The mounting device of the claim 1, wherein the mounting member comprises a base plate, a sleeve, and a separate locater; and the separate locater is located between the sleeve and the printed circuit board for spacing the printed circuit board from the supporting board.

6. The mounting device of the claim 1, wherein the connecting claw is tapered.

7. The mounting device of the claim 1, wherein the connecting piece further comprises an L-shaped connecting body, and the connecting body is riveted to the chassis.

8. The mounting device of the claim 1, wherein the mounting member comprises a mounting claw penetrating into the supporting board.

9. The mounting device of the claim 8, wherein the mounting claw has a straight side edge and an arcuate side edge.

10. The mounting device of the claim 8, wherein the connecting claw penetrates into the supporting board from a first direction, and the mounting claw penetrates into the supporting board from a second direction that is opposite to the first direction.

11. A mounting device for a printed circuit board, comprising:
    a supporting board, the supporting board comprising non-metallic material;
    a connecting piece, the connecting piece being secured to a chassis and configured to secure the supporting board to the chassis; and
    a mounting member extending through the supporting board, the mounting member having a mounting claw penetrating into the supporting board.

12. The mounting device of the claim 11, wherein the supporting board comprises medium density fiberboard.

13. The mounting device of the claim 11, wherein the mounting member further comprises a sleeve, and the sleeve has internal threads.

14. The mounting device of the claim 11, wherein the connecting piece comprises metal.

15. The mounting device of the claim 11, wherein the mounting member comprises a base plate, a sleeve, and a separate locater; and the separate locater is located between the sleeve and the printed circuit board for spacing the printed circuit board from the supporting board.

16. The mounting device of the claim 11, wherein the mounting claw is tapered.

17. The mounting device of the claim 11, wherein the connecting piece is riveted to a chassis.

18. The mounting device of the claim 11, wherein the connecting member comprises a connecting claw penetrating into the supporting board.

19. The mounting device of the claim 18, wherein the mounting claw has a straight side edge and an arcuate side edge.

20. The mounting device of the claim 18, wherein the connecting claw penetrates into the supporting board from a first direction, and the mounting claw penetrates into the supporting board from a second direction, that is opposite to the first direction.

* * * * *